United States Patent [19]

Crivello

[11] 4,081,276
[45] Mar. 28, 1978

[54] PHOTOGRAPHIC METHOD
[75] Inventor: James V. Crivello, Elnora, N.Y.
[73] Assignee: General Electric Company, Schenectady, N.Y.
[21] Appl. No.: 733,235
[22] Filed: Oct. 18, 1976
[51] Int. Cl.$^2$ .................. G03C 5/00; G03C 5/04; G03F 7/02
[52] U.S. Cl. .................. 96/35.1; 96/27 R; 96/33; 204/159.18; 204/159.23
[58] Field of Search .......... 96/27, 33, 35.1, 115 P, 96/115 R; 204/159.11, 159.18, 159.22, 159.23

[56] References Cited

U.S. PATENT DOCUMENTS

| | | | |
|---|---|---|---|
| 3,729,313 | 4/1973 | Smith | 96/27 R |
| 3,816,280 | 6/1974 | Watt | 96/115 P |
| 3,816,281 | 6/1974 | Feinberg | 96/115 P |
| 3,826,650 | 7/1974 | Schlesinger | 96/36.4 |
| 3,961,947 | 6/1976 | Wells | 96/1 R |

*Primary Examiner*—Jack P. Brammer
*Attorney, Agent, or Firm*—William A. Teoli; Joseph T. Cohen; Jerome C. Squillaro

[57] ABSTRACT

A method is described for forming an image or design on the surface of a substrate by treating the substrate with a photoinitiator, such as triphenylsulfonium hexafluoroantimonate. A mask can be placed on the treated substrate which is exposed to radiant energy, resulting in the formation of a cationic polymerization catalyst on the exposed substrate surface. The substrate can then be contacted with a cationically polymerizable organic material, such as an epoxy resin, resulting in the formation of an adherent organic film on the surface of the substrate which has been exposed.

10 Claims, No Drawings

PHOTOGRAPHIC METHOD

The present invention relates to a photographic method of applying an organic resin onto a substrate in a patterned manner. More particularly, the present invention relates to a method for applying a photoresist onto a substrate in a patterned manner to provide for the production of printed circuits.

Prior to the present invention, printed circuits were made by applying a metal, such as copper or aluminum onto a substrate and spinning a negative photoresist onto the substrate, followed by exposure of the photoresist while it was in contact with a mask to ultraviolet light. The resulting exposed composite was then developed to effect the removal of the unexposed photoresist which was soluble in an organic solvent and the exposed metal was etched with a suitable etchant. The insoluble photoresist was then removed by chemical processing to produce a patterned printed circuit on a substrate, such as a copper clad laminate. Another method, as shown by Wright et al, U.S. Pat. No. 3,664,899, was based on the use of a surface photopolymerized organic film in place of the photosensitive spinable photoresist. Removal of the surface photopolymerized coating in a patterned manner was achieved by employing a positive photoresist mask and the removal of the exposed organic film in an atmosphere containing oxygen and ultraviolet light.

Although the above procedures for employing a positive and negative photoresist provided a wide variety of printed circuit boards, the procedures were often time consuming and required expensive apparatus and a multitude of steps.

The present invention is based on the discovery that certain photoinitiators having the formula $$[Y]_c^+ [MQ_d]^{-(d-e)} \quad (1),$$

where Y, M, Q, c, d and e are defined below, can be applied to a substrate from dilute coating solution and thereafter provide, for purposes of cationic polymerization, a cationic polymerization catalyst upon exposure to ultraviolet light.

Unexpectedly, the cationic polymerization catalyst remains in a latent state until it is contacted with a cationically polymerizable material, such as an epoxy resin or cyclic ether in the form of a vapor or liquid. Cure of the organic monomer or prepolymer can be effected within a second or more, resulting in a protective organic film useful as a photoresist having a thickness of 0.6 microns or more. Removal of the photoresist is also readily achieved with an organic solvent. Monomer cure only occurs at sites on the substrate which have received prior exposure to ultraviolet light.

There is provided by the present invention, a photographic method which comprises, (1) applying a photoinitiator onto a substrate, where the photoinitiator is capable of releasing a cationic polymerization catalyst upon exposure to radiant energy, (2) exposing at least a portion of the applied photoinitiator to radiant energy, and (3) effecting contact between such exposed photoinitiator and cationically polymerizable organic material resulting in the production of an adherent organic film.

Photoinitiators which can be used in the practice of the method of the present invention are shown by formula (1), where Y is a cationic group selected from the class consisting of

M is selected from a metal or metalloid, Q is a halogen radical, R is a monovalent aromatic organic radical, $R^1$ is a divalent aromatic organic radical, $R^2$ and $R^4$ are monovalent organic aliphatic radicals selected from alkyl, cyclo alkyl and substituted alkyl, $R^3$ and $R^5$ are polyvalent organic radicals forming a heterocyclic or fused ring structure with E or G, D is a halogen radical, such as I, E is a Group Va element selected from N, P, As, Sb and Bi, G is a group VIa element selected from S, Se and Te, "$a$" is a whole number equal to 0 or 2, "$b$" is a whole number equal to 0 or 1 and the sum of "$a$" + "$b$" is equal to 2 or the valence of D, "$f$" is a whole number equal to 0 to 4 inclusive, "$g$" is a whole number equal to 0 to 2 inclusive, "$h$" is a whole number equal to 0 to 2 inclusive and the sum of "$f$" + "$g$" + "$h$" is a value equal to 4 or the valence of E, "$j$" is a whole number equal to 0 to 3 inclusive, "$k$" is a whole number equal to 0 to 2 inclusive and "$m$" is a whole number equal to 0 or 1, where the sum of "$j$" + "$k$" + "$m$" is a value equal to 3 or the valence of G, $$c = d - e,$$

$e$ is equal to the valence of M and is an integer equal to 2-7 inclusive, and $d > e$ and is an integer having a value up to 8.

Radicals included by R can be the same or different, aromatic carbocyclic or heterocyclic radicals having from 6 to 20 carbon atoms, which can be substituted with from 1 to 4 monovalent radicals selected from $C_{(1-8)}$ alkoxy, $C_{(1-8)}$ alkyl, nitro, chloro, etc., R is more particularly phenyl, chlorophenyl, nitrophenyl, methoxyphenyl, pyridyl, etc. Radicals included by $R^1$ are divalent radicals, such as

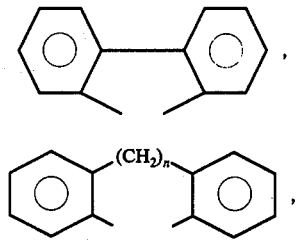

$R^2$ and $R^4$ radicals include $C_{(1-8)}$ alkyl, such as methyl, ethyl, etc., substituted alkyl, such as $-C_2H_4OCH_3$, $-CH_2COOC_2H_5$, $-CH_2COCH_3$, etc. $R^3$ and $R^5$ radicals include such structures as

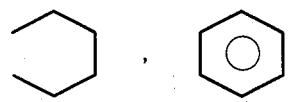

where Q' is selected from 0, $CH_2$, NR', CO, $CH_2CH_2$ and S; Z is selected from $-O-$, $-S-$ and $-N-$, and R' is a monovalent radical selected from hydrogen and hydrocarbon.

Metal or metalloids included by M of formula 1 are transition metals such as Sb, Fe, Sn, Bi, Al, Ga, In, Ti, Zr, Sc, V, Cr, Mn, Cs, rare earth elements such as the lanthanides, for example, Cd, Pr, Nd, etc., actinides, such as Th, Ta, U, Np, etc., and metalloids such as B, P, As, etc. Complex anions included by $MQ_d^{-(d-e)}$ are, for example, $BF_4^-$, $PF_6^-$, $AsF_6^-$, $SbF_6^-$, $FeCl_4^-$, $SnCl_6^-$, $SbCl_6^-$, $BiCl_5^-$, etc.

Halonium salts included by formula 1 are, for example,

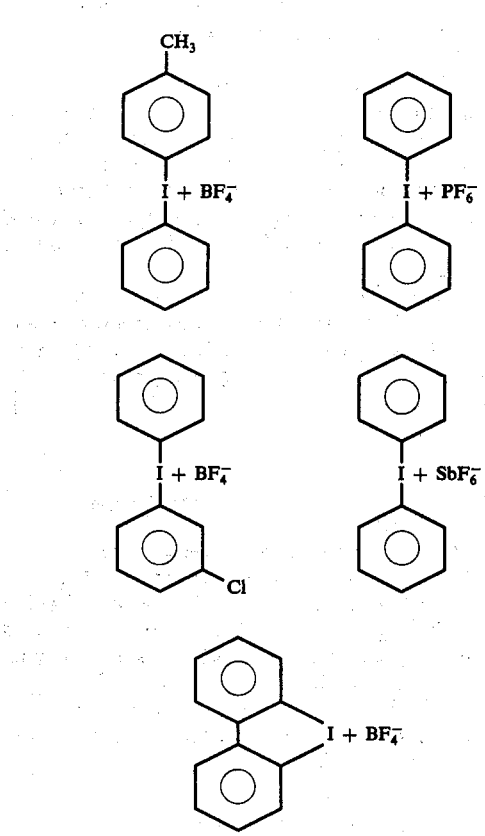

Group Va onium salts included by formula 1 are, for example

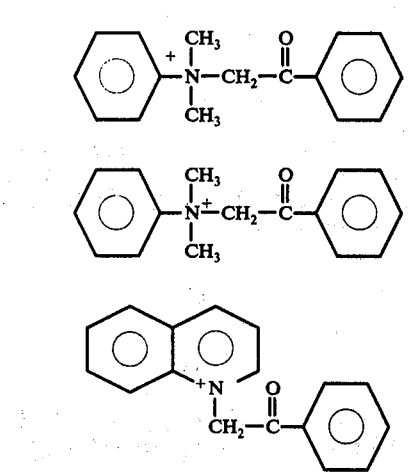

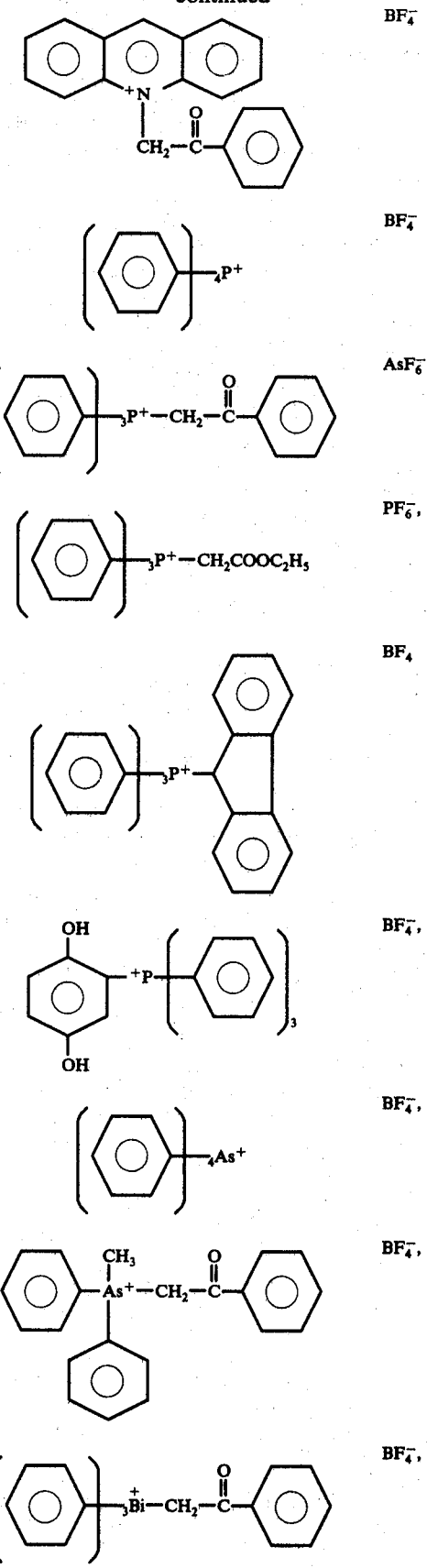

Group VIa onium salts included by formula (1) are, for example,

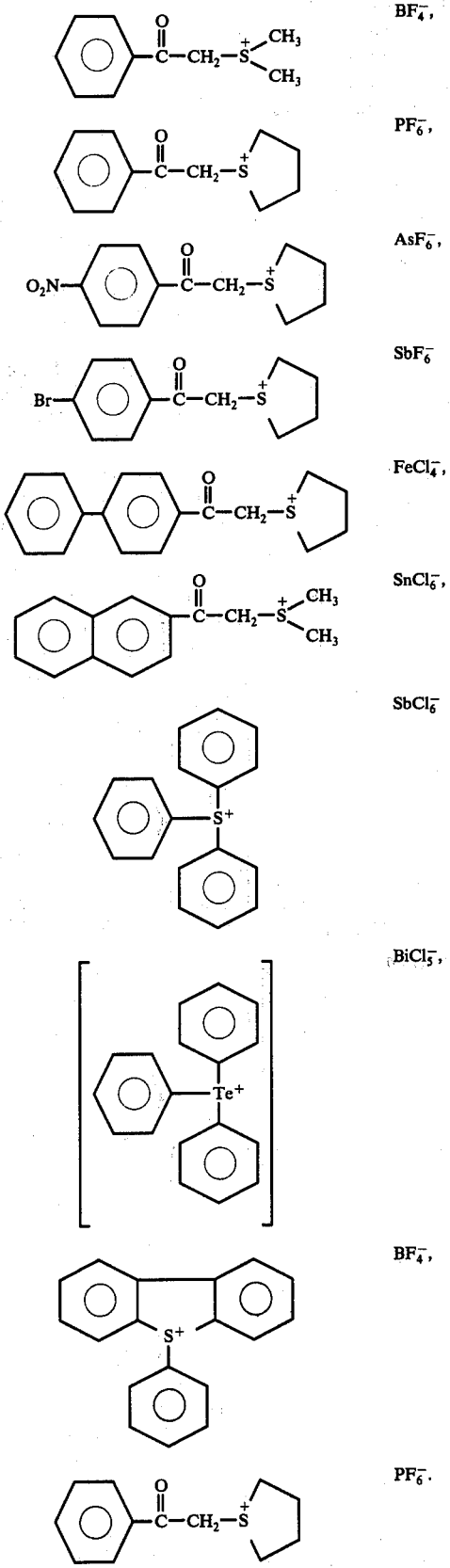

Some of the photoinitiators of formula 1 are well known and can be made by the procedures shown in J. W. Knapczyk and W. E. McEwen, J. Am. Chem. Soc., 91 145, (1969); A. L. Maycock and G. A. Berchtold, J. org. Chem. 35, No. 8, 2532 (1970); H. M. Pitt, U.S. Pat. No. 2,807,648, E. Goethals and P. De Radzetzky, Bul. Soc. Chim. Bleg., 73 546 (1964); H. M. Leichester and F. W. Bergstrom, J. Am. Chem. Soc., 51 3587 (1929), etc.

Cationically polymerizable organic materials which can be employed in the practice of the method of the present invention to form thin organic films capable of functioning as photoresists on various substrates useful for making printed circuit elements are, for example, epoxy resins which include any monomeric, dimeric or oligomeric or polymeric epoxy material containing one or a plurality of epoxy functional groups. For example, those resins which result from the reaction of bisphenol-A (4,4'-isopropylidenediphenol) and epichlorohydrin, or by the reaction of low molecular weight phenol-formaldehyde resins (Novolak resins) with epichlorohydrin, can be used alone or in combination with an epoxy containing compound as a reactive diluent. Such diluents as phenyl glycidyl ether, 4-vinylcyclohexene dioxide, limonene dioxide, 1,2-cyclohexene oxide, glycidyl acrylate, glycidyl methacrylate, styrene oxide, allyl glycidyl ether, etc., may be added as viscosity modifying agents.

In addition, the range of these compounds can be extended to include polymeric materials containing terminal or pendant epoxy groups. Examples of these compounds are vinyl copolymers containing glycidyl acrylate or methacrylate as one of the comonomers. Other classes of epoxy containing polymers amenable to cure using the above catalysts are epoxy-siloxane resins, epoxy-polyurethanes and epoxy-polyesters. Such polymers usually have epoxy functional groups at the ends of their chains. Epoxy-siloxane resins and method for making are more particularly shown by E. P. Plueddemann and G. Fanger, J. Am. Chem. Soc. 80 632-5 (1959). As described in the literature, epoxy resins can also be modified in a number of standard ways such as reactions with amines, carboxylic acids, thiols, phenols, alcohols, etc., as shown in U.S. Pat. Nos. 2,935,488; 3,235,620; 3,369,055; 3,379,653; 3,398,211; 3,403,199; 3,563,850; 3,567,797; 3,677,995; etc. Further examples of epoxy resins which can be used are shown in the Encyclopedia of Polymer Science and Technology, Vol. 6, 1967, Interscience Publishers, New York, pp 209,271.

Additional examples of cationically polymerizable organic materials include vinyl organic monomers, such as styrene, vinyl acetamide, α-methyl styrene, isobutyl vinylether, n-octyl vinylether, acrolein, 1,1-diphenylethylene, β-pinene; vinyl arenes such as 4-vinyl biphenyl, 1-vinyl pyrene, 2-vinyl fluorene, acenaphthylene, 1 and 2-vinyl naphthylene; 9-vinyl carbazole, vinyl pyrrolidone, 3-methyl-1-butene; vinyl cycloaliphatics such as vinylcyclohexane, vinylcyclopropane, 1-phenylvinylcyclopropane; dienes such as isobutylene, isoprene, butadiene, 1,4-pentadiene, etc.

Some of the vinyl organic prepolymers which can be used to make the polymerizable compositions of the present invention are, for example, $CH_2{=}CH{-}O{-}(CH_2{-}CH_2O)_n{-}CH{=}CH_2$, where $n$ is a positive integer having a value up to about 1000 or higher; multi-functional vinylethers, such as 1,2,3-propane trivinyl ether, trimethylolpropane trivinyl ether, prepolymers having the formula,

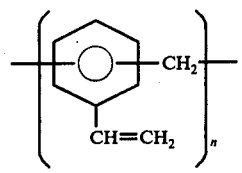

low molecular weight polybutadiene having a viscosity of from 200 to 10,000 centipoises at 25° C, etc. Products resulting from the cure of such compositions can be used as potting resins, crosslinked coatings, printing inks, etc.

A further category of the organic materials which can be used to make polymerizable compositions are cyclic ethers which are convertible to thermoplastics. Included by such cyclic ethers are, for example, oxetanes such as 3,3-bis-chloromethyloxetane, alkoxyoxetanes as shown by Schroeter U.S. Pat. No. 3,673,216, assigned to the same assignee as the present invention; oxolanes such as tetrahydrofuran, oxepanes, oxygen containing spiro compounds, trioxane, dioxolane, etc.

In addition to cyclic ethers there are also included cyclic esters such as β-lactones, for example, propiolactone, cyclic amines, such as 1,3,3-trimethylazetidine and organosilicon cyclics, for example, materials included by the formula,

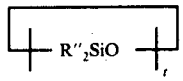

where R″ can be the same or different monovalent organic radicals such as methyl or phenyl and $t$ is an integer equal to 3 to 8 inclusive. An example of an organosilicon cyclic is hexamethyl trisiloxane, octamethyl tetrasiloxane, etc. The products made in accordance with the present invention are higher molecular weight oils and gums.

In the practice of the invention the photoinitiator is applied onto a substrate which is preferably achieved by use of a solution of the aromatic onium salt in an organic solvent. Prior to exposing the applied photoinitiator to ultraviolet light, a mask can be applied on the treated substrate to produce a photograph of the mask. The exposed photoinitiator can then be contacted to the photopolymerizable organic material, or "organic resin" as previously defined, to effect a rapid cure of the organic resin resulting in the production of an organic film whose thickness can be influenced by the contact time to the exposed photoinitiator. A negative photograph of the mask is formed, as shown by a pattern of cured organic film on the substrate.

The photographic method of the present invention can be used to make printed circuits when the substrate is in the form of a metal clad laminate, such as a copper clad laminate, aluminum clad laminate, etc. The cured organic resin film can be employed as a negative photoresist on the metal clad laminates. Exposed areas of the metal can be etched in a standard manner in accordance with well known procedures. For example, one could employ a solution of chromium trioxide (40 parts), sulfuric acid (20 parts), dissolved in about 2,000 parts of water to etch silver. Copper can be etched using a ferric chloride solution which is between 2.25 and 3.75 molar at temperatures between 32° to 50° C. Aluminum can be etched using an aqueous alkali hydroxide solution, such as 5 normal potassium hydroxide solution in combination with potassium bromate or an aqueous 20% sodium hydroxide solution at 60°–80° C. Removal of the organic film resist after the etching of the exposed metal can be accomplished by using an organic solvent, such as $CH_2Cl_2$ or $CHCl_2$—$CH_2Cl$. If desired, the photoresist layers can be used as passivating layers without any necessity for removal.

Some of the photoinitiators included by formula (1), such as where Y is (i), can be made by effecting contact under aqueous conditions between an aryl halonium bisulfate and the corresponding hexafluoro acid or salt, such as $Y^1MF_6$, where $Y^1$ can be hydrogen, an alkali metal ion, an alkaline earth metal ion, or transition metal ion.

In addition to the above-described metathesis for making the corresponding haloniun salts, the halonium salts of the present invention, also can be prepared by using silver compounds, such as silver oxide, or silver tetrafluoroborate, which were reacted with the appropriate diarylhalonium salt, as shown by M. C. Caserio et al., J. Am. Chem. Soc. 81, 336 (1959) or M. C. Beringer et al, J. Am. CHem. Soc. 81, 342 (1959). Methods for making Group VIa compounds, such as sulfonium, selenium and tellurium compounds, where Y of formula (1) is a (ii) radical can be made by procedures shown in J. W. Knapczyk and W. E. McEwen, J. Am. Chem. Soc., 91 145, (1969); A. L. Maycock and G. A. Berchtold, J. Org. Chem., 35 No. 8,2532 (1970); H. M. Pitt, U.S. Pat. No. 2,807,648, E. Goethals and P. De Radzetzky, Bul. Soc. Chim. Belg., 73 546 (1964); H. M. Leichester and F. W. Bergstrom, J. Am. Chem. Soc., 51 3587 (1929), etc.

Among the procedures which can be used to make Group Va onium salts, such as arsonium, Antimonium and bismuthonium salts, where Y in formula (1) is a (iii) radical can be found in Goerdeler, Methoden der Organishen Chimie 11/2, 591–640 (1958) and K. Sasse, idid, 12/1 79–112 (1963).

In order that those skilled in the art will be better able to practice the invention, the following examples are given by way of illustration and not by way of limitation. All parts are by weight.

EXAMPLE 1.

A glass plate was coated with a 10% solution of triphenylsulfonium hexafluoroarsenate in chloroform which was made by the procedures described by H. M. Leicester and F. W. Bergstrom, J. Am. Chem. Soc. 51 3587 (1929). The solvent was removed by drying leaving a thin film of photoinitiator on the plate. The sensitized plate was covered with a perforated mask and irradiated for 20 seconds using a G.E. H3T7 medium pressure mercury arc lamp. The exposed plate was then contacted for two minutes to a wet film of 4-vinyl cyclohexene dioxide. The plate was then washed with benzene which showed a negative image of the perforated mask in the form of an upraised crosslinked film of the polymerized 4-vinyl cyclohexene dioxide.

EXAMPLE 2.

In accordance with the procedure of Example 1, a sensitized image of photoiniator was made on a glass plate. The plate containing the latent image was then placed into a desiccator and exposed to 4-vinyl cyclohexene dioxide vapor at a partial pressure of about 14 Torr. A thin polymeric film formed on the glass plate within about 10 seconds which was readily visible. The extreme thinness of the film was apparent from the formation of a series of interference colors on the film surface. After 30 seconds exposure, the glass plate was removed from the vacuum chamber and examined. It was noted that polymerization had occurred only in those areas which had originally been exposed to ultraviolet light. The glass plate was then developed as described in Example 1, leaving a durable photoimage of the mask.

EXAMPLE 3.

A 0.3 mil draw bar was used to spread a 10% solution of triphenylsulfonium hexafluoroantimonate in chloroform onto a 3 inch by 6 inch strip of steel. The applied solution was allowed to dry. A perforated aluminum mask was then placed in contact with the treated steel strip which was then irradiated for 20 seconds using a G. E. H3T7 medium pressure mercury arc lamp. The steel strip was then dipped into a 60/40 mixture of Dow 431 Epoxy Novolac and 4-vinyl cyclohexene dioxide followed by a brief heat treatment at 100° C for 15 minutes. A hard coating was obtained on the steel plate which was washed with acetone revealing a photograph of the aluminum mask.

The above procedure was repeated, except that the epoxy mixture was replaced with diethyleneglycol divinylether. A crosslinked soluble film was obtained following the same procedure.

EXAMPLE 4.

A copper clad laminate consisting of a 0.001 inch copper film on an epoxy resin-filber glass substrate was dipped into a 10% methylene chloride solution of triphenylsulfonium hexafluoroantimonate. The solution was then exposed to air to produce a dry coating of the photoinitiator on the copper surface.

A mask was then placed on the coated circuit board and it was exposed to ultraviolet light for 1.5 minutes using a G.E. H3T7 mercury arc lamp. The circuit board was then placed in a desiccator containing a small container of isopropyl vinylether. After 2 minutes exposure under partial pressure, the circuit board was removed and washed with methanol. It was then immersed into a saturated ferric chloride solution. A negative image of the mask was obtained. Those skilled in the art would know that the resulting printed circuit board would be useful in a variety of electronic applications. In addition, the photoresist covering the metallic image could readily be removed by use of an organic solvent, such as methylene chloride, if desired.

EXAMPLE 5.

A vacuum aluminized glass slide was treated with a 10% solution of triphenylsulfonium hexafluoroantimonate as described in Example 4. The treated slide was then covered with a mask and irradiated as described above. The glass slide was then exposed for five minutes to 1,2,7,8-diepoxy octane vapors. The treated slide was then immersed into a 50% aqueous sodium hydroxide solution. There was obtained a negative aluminum image of the mask.

In addition to the above-described methods for making the photoinitiators of formula 1, there also can be employed the procedure shown in U.S. Pat. No. 3,981,897, Crivello, assigned to the same assignee as the present invention.

Although the above examples are limited to only a few of the very many variables which can be employed in the practice of the method of the present invention, those skilled in the art would know that there could be used a much broader variety of photoinitiators, such as shown by formula 1, or cationically polymerizable material, such as epoxy resin or vinyl organic monomers as described in the specification preceding these examples.

What I claim as new and desire to secure by Letters Patent of the U.S. is:

1. A photographic method which comprises,
   (1) applying a photoinitiator onto a substrate, where the photoinitiator is capable of releasing a cationic polymerization catalyst upon exposure to radiant energy,
   (2) exposing at least a portion of the applied photoinitiator to radiant energy, and
   (3) effecting contact between such exposed photoinitiator and cationically polymerizable organic material resulting in the production of an adherent organic film, where the photoinitiator has the formula, $$[Y]_c^+ [MQ_d]^{-(d-e)},$$

where Y is a cationic group selected from the class consisting of $$(R)_a(R^1)_b D$$

$$(R)_f(R^2)_g(R^3)_h E,$$

$$(R)_j(R^4)_k(R^5)_m G,$$

M is selected from a metal or metalloid, Q is a halogen radical, R is a monovalent aromatic organic radical, $R^1$ is a divalent aromatic organic radical, $R^2$ and $R^4$ are monovalent organic aliphatic radicals selected from alkyl, cyclo alkyl and substituted alkyl, $R^3$ and $R^5$ are polyvalent organic radicals forming a heterocyclic or fused ring structure with E or G, D is a halogen radical, E is a Group Va element selected from N, P, As, Sb and Bi, G is a Group VIa element selected from S, Se and Te, "$a$" is a whole number equal to 0 or 2,
   "$b$" is a whole number equal to 0 or 1 and the sum of "$a$" + "$b$" is equal to 2 or the valence of D,
   "$f$" is a whole number equal to 0 to 4 inclusive,
   "$g$" is a whole number equal to 0 to 2 inclusive,
   "$h$" is a whole number equal to 0 to 2 inclusive and the sum of "$f$" + "$g$" + "$h$" is a value equal to 4 or the valence of E,
   "$j$" is a whole number equal to 0 to 3 inclusive,
   "$k$" is a whole number equal to 0 to 2 inclusive and
   "$m$" is a whole number equal to 0 to 1, where the sum of "$j$" + "$k$" + "$m$" is a value equal to 3 or the valence of G, $c = d - e$,
   $e$ is equal to the valence of M and is an integer equal to 2-7 inclusive, and
   $d > e$ and is an integer having a value up to 8.

2. A method in accordance with claim 1, where the cationically polymerizable organic material is an epoxy resin.

3. A method in accordance with claim 1, where the cationically polymerizable organic material is a cyclic ether.

4. A method in accordance with claim 1, where the photoinitiator is an aromatic halonium salt.

5. A method in accordance with claim 1, where the photoinitiator is an onium salt of a Group Va element.

6. A method in accordance with claim 1, where the photoinitiator is an onium salt of a Group VIa element.

7. A method in accordance with claim 1, where the photoinitiator is triphenylsulfonium hexafluoroarsenate.

8. A method in accordance with claim 1, where the photoinitiator is triphenylsulfonium hexafluoroantimonate.

9. A method in accordance with claim 1, where the cationically polymerizable organic material is 4-vinyl cyclohexene dioxide.

10. A method in accordance with claim 1, where the cationically polymerizable organic material is 1,2,7,8-diepoxy octane.

* * * * *